United States Patent
Lin et al.

(10) Patent No.: US 6,538,582 B1
(45) Date of Patent: Mar. 25, 2003

(54) KEY-PRESSING CIRCUIT

(75) Inventors: Hwan-Rong Lin, Chang Hua Hsien (TW); Ta-Yuan Lee, Taipei (TW)

(73) Assignee: Benq Corporation, Taoyuan (TW)

( * ) Notice: Subject to any disclaimer, the term of this patent is extended or adjusted under 35 U.S.C. 154(b) by 242 days.

(21) Appl. No.: 09/651,581

(22) Filed: Aug. 29, 2000

(30) Foreign Application Priority Data

Nov. 19, 1999 (TW) ........................................ 88120281 A

(51) Int. Cl.$^7$ ............................................. H03M 11/00
(52) U.S. Cl. ............................. 341/22; 341/26; 345/168
(58) Field of Search ........................... 341/26, 20, 22; 345/168; 200/600; 400/477, 479

(56) References Cited

U.S. PATENT DOCUMENTS

| | | | | |
|---|---|---|---|---|
| 4,015,254 A | * | 3/1977 | Strandt | 341/22 |
| 5,619,196 A | * | 4/1997 | Escobosa | 341/22 |
| 5,929,790 A | * | 7/1999 | Lim | 341/22 |
| 5,983,116 A | * | 11/1999 | Nash et al. | 455/550 |
| 6,005,499 A | * | 12/1999 | Shafer | 341/34 |
| 6,178,388 B1 | * | 1/2001 | Claxton | 702/107 |
| 6,184,805 B1 | * | 2/2001 | Uggmark | 341/29 |
| 6,222,466 B1 | * | 4/2001 | Uggmark | 341/22 |

* cited by examiner

Primary Examiner—Michael Horabik
Assistant Examiner—Albert K. Wong
(74) Attorney, Agent, or Firm—Winston Hsu

(57) ABSTRACT

A key-pressing circuit has a control unit, a first charge storage circuit, and a key matrix circuit. The control unit has a controlling port and a detecting port, and the controlling port can be in either a grounded state or a floating state. The first charge storage circuit has a charging port that connects to the detecting port of the control unit. The key matrix circuit has a plurality of resistors and an associated plurality of switches. The resistors are connected together in series, forming a series resistor circuit that has a first end and a second end. One end of each switch connects to an end of its associated resistor. The other end of each switch connects to the controlling port of the control unit. The first end of the series resistor circuit connects to the charging port of the first charge storage circuit. The detecting port detects if the charging port of the first charge storage circuit reaches a predetermined voltage. The control unit measures the time period from when the controlling port is set to a grounded state till the detecting port detects a predetermined voltage, and the control unit determines the corresponding position of the actuated switch according to this time period.

20 Claims, 5 Drawing Sheets

KEY-PRESSING CIRCUIT

BACKGROUND OF THE INVENTION

1. Field of the Invention

The present invention relates to a key-pressing circuit, and more particularly, to a key-pressing circuit that can determine the corresponding position of an actuated key according to its discharging time period.

2. Description of the Prior Art

Please refer to FIG. 1. FIG. 1 is a schematic diagram of a prior art key-pressing circuit 10. The key-pressing circuit 10 comprises m drive lines A,B,C . . . ,M used to input a scan pulse, n output lines a,b,c, . . . ,n used to output the scan pulse, and m*n keys Aa,Ab, . . . ,Mn arranged in a matrix. A scan pulse is input into the m drive lines one by one in rotation. If the scan pulse is input into the drive line B, and the key Bb is actuated, a current will flow from the drive line B through the key Bb and then to the output line b (as depicted by the solid line 12). Hence, the output line b will deliver the scan pulse signal and from this it can be deduced that key Bb is actuated.

However, if the scan pulse is input into the drive line B, and the keys Bb, Cb and Cd are all simultaneously actuated, then in addition to an output pulse on line b, there will also be an output pulse on line d (as indicated by the dashed line 14). An output pulse on line d with an input pulse from line B will force the conclusion that the key Bd has been actuated, which is incorrect. So, in this situation, a false code is generated, a so-called "ghost key" or "phantom key". In addition to this shortcoming, the m drive lines and n output lines of the key-pressing circuit 10 must occupy m+n ports of a processor. The usage of so many ports is not economical.

Another prior art method, U.S. Pat. No. 5,619,169, addresses a key-pressing circuit using a single transmission wire. In this circuit a plurality of resistors with the same resistance are arranged in series and connect to a capacitor. When a key is actuated the capacitor will discharge via the series resistors coupled to ground. By monitoring the time of the discharge, the key that was actuated can be determined. This prior art method, however, only permits one discharge process for a single key actuation, and so errors can easily occur. Consequently, it can only detect one key press at a time, and so cannot be applied to situations where two or more keys are actuated simultaneously.

SUMMARY OF THE INVENTION

It is therefore a primary objective of the present invention to provide a key-pressing circuit which can determine the corresponding position of an actuated key according to its discharging time period with a property that, within the time period that the key is actuated once, a discharge process is performed many times to solve the above mentioned problem.

In a preferred embodiment, the present invention provides a key-pressing circuit used for encoding and decoding key-press position information of a keyed input device, the key-pressing circuit has a control unit. The control unit comprises a controlling port and a detecting port. The controlling port can be in either a grounded state or a floating state. The key-pressing circuit also has a first charge storage circuit, which has a charging port that connects to the detecting port of the control unit, and a key matrix circuit. The key matrix circuit has a plurality of resistors and an associated plurality of switches. Each of the resistors and each of the switches has a first end and a second end. The first end of each resistor connects to the second end of its neighboring resistor so that the plurality of resistors forms a series resistor circuit that has a first end and a second end. The first end of each switch separately connects to the second end of its associated resistor. The second end of each switch connects to the controlling port of the control unit. The first end of the series resistor circuit connects to the charging port of the first charge storage circuit. When a switch is actuated and the controlling port is in the grounded state, the first charge storage circuit will discharge. However, when a switch is actuated and the controlling port is in the floating state, the first charge storage circuit will recharge. The detecting port detects if the charging port of the first charge storage circuit reaches a predetermined voltage. The control unit measures the time period from when the controlling port reached the grounded state till the detecting port detects the predetermined voltage, and the control unit determines the corresponding position of the actuated switch according to this time period.

It is an advantage of the present invention that the key-pressing circuit does not have the said "ghost key" problem and needs fewer processor ports than the prior art key-pressing circuit. Furthermore, a discharge process is performed many times within the time period of a typical key actuation, so the determination of the corresponding position of an actuated key will be more accurate.

These and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
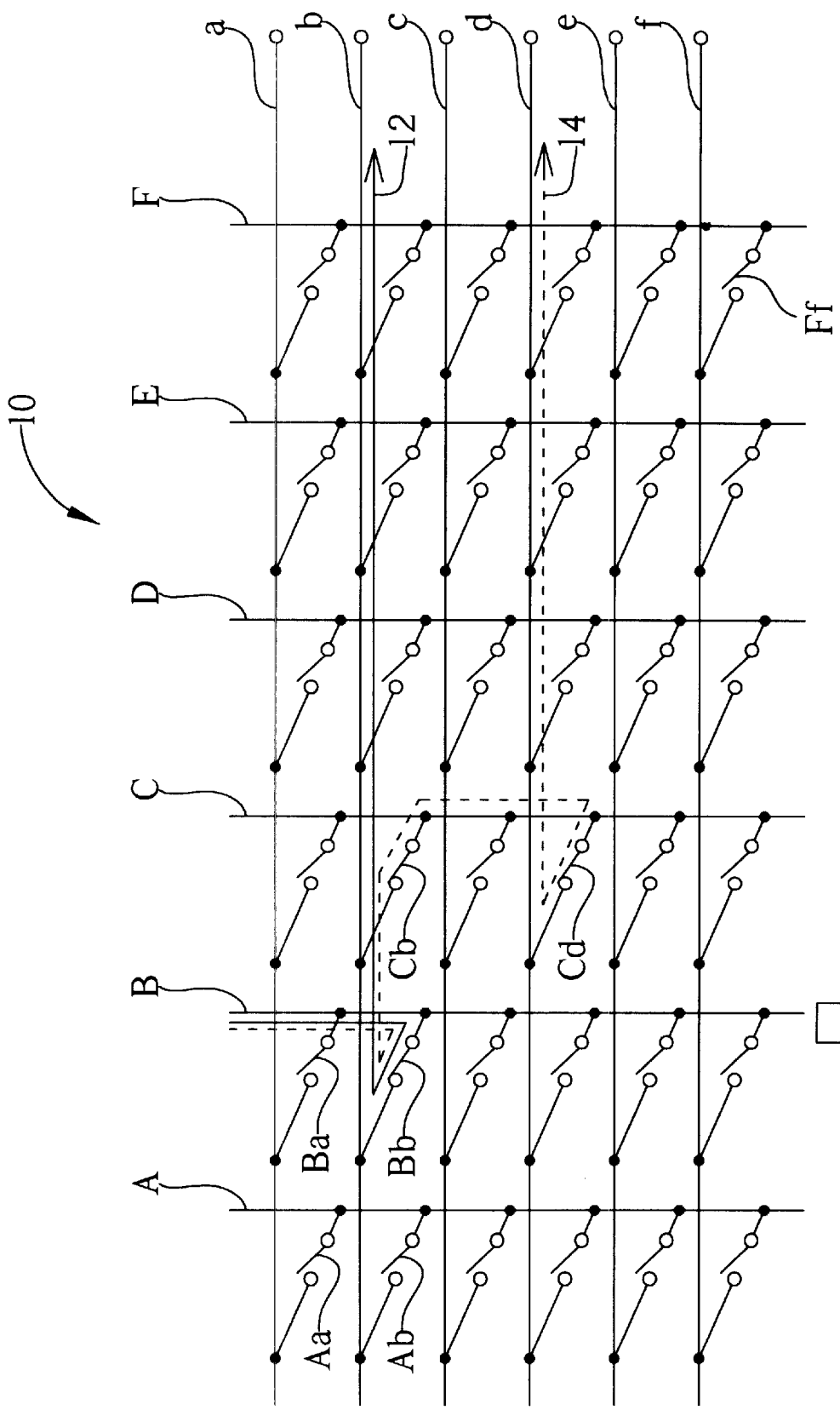
FIG. 1 is a schematic diagram of a prior art key-pressing circuit.
Figure 2:
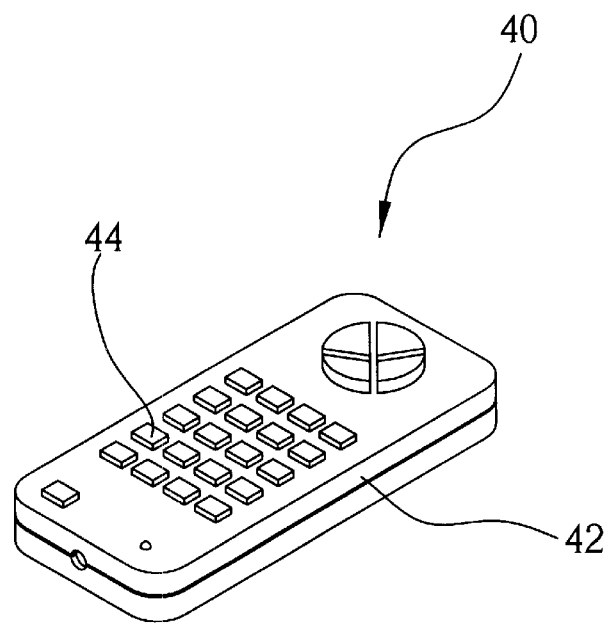
FIG. 2 is a perspective view of a keypad of a remote controller.
Figure 3:
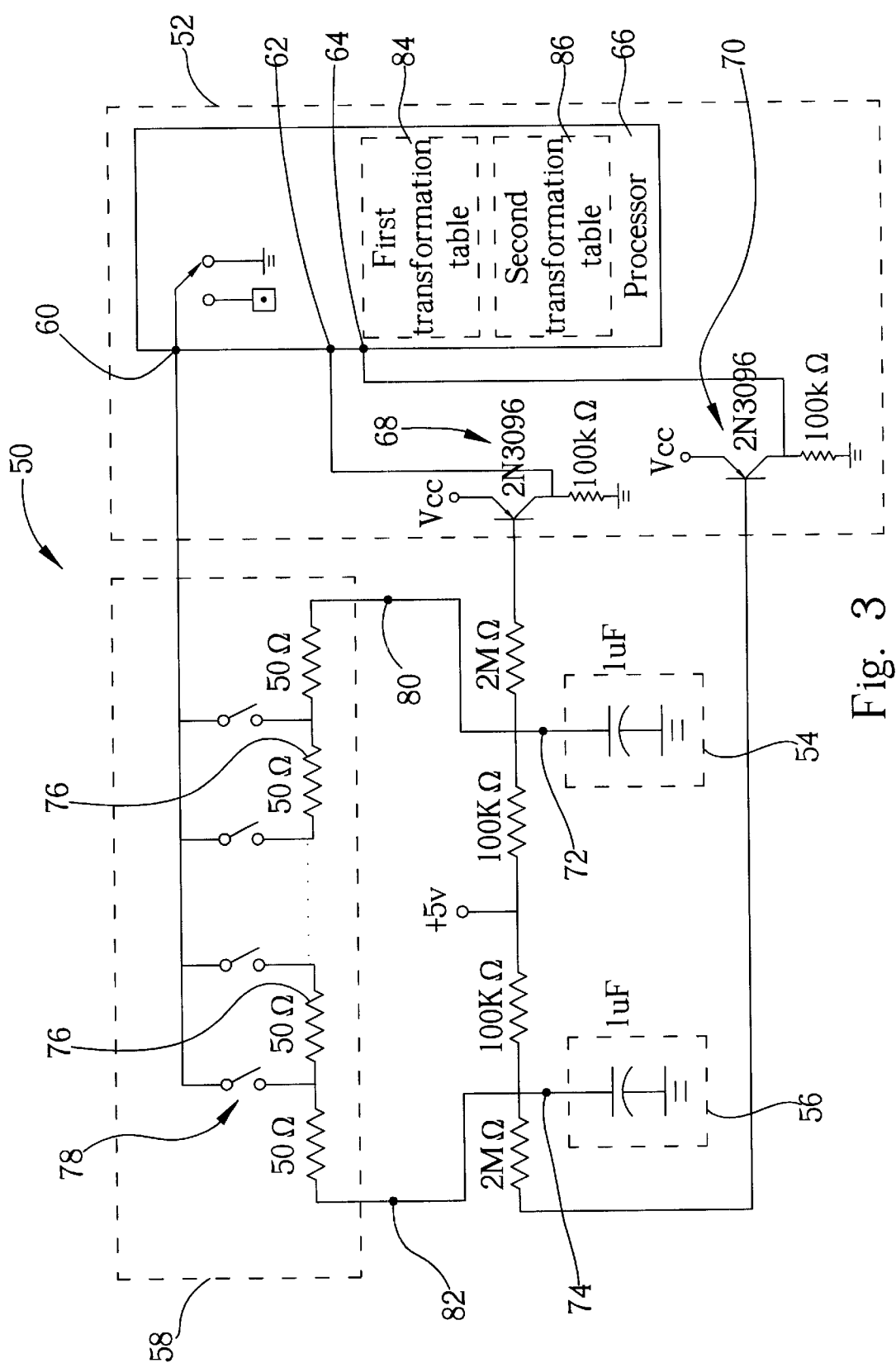
FIG. 3 is a schematic diagram of a present invention key-pressing circuit.

Please refer to FIG. 2 and FIG. 3. FIG. 2 is a perspective view of a keypad 40 of a remote controller. FIG. 3 is a schematic diagram of a present invention key-pressing circuit 50. The present invention key-pressing circuit 50 can be an encoding-and-decoding circuit of the keypad 40 of a remote controller (FIG. 3). The keypad 40 comprises a housing 42, and a group of keys 44 installed on the housing in a pressable manner. The key-pressing circuit 50 comprises a control unit 52, a first charge storage circuit 54, a second charge storage circuit 56, and a key matrix circuit 58 installed under the keys 44.

The control unit 52 comprises a processor 66 having a controlling port 60 and two detecting ports 62, 64, and two voltage sensing units 68, 70.

The first charge storage circuit 54 comprises a charging port 72 that connects to the detecting port 62 of the control unit 52 via the voltage sensing unit 68. The second charge storage circuit 56 also comprises a charging port 74 that connects to the other detecting port 64 of the control unit 52 via the voltage sensing unit 70.

The key matrix circuit 58 comprises a plurality of resistors 76 and an associated plurality of switches 78. Each of the resistors 76 and each of the switches 78 have a first end and a second end. The first end of each resistor 76 connects to the second end of its neighboring resistor 76 so that the plurality of resistors 76 forms a series resistor circuit that has a first end 80 and a second end 82. The first end 80 of the series resistor circuit connects to the charging port 72 of the first charge storage circuit 54. The first charge storage circuit 54 comprises a capacitor that connects to the first end 80 of the series resistor circuit to form an RC circuit. The second charge storage circuit 56 comprises a capacitor that connects to the second end 82 of the series resistor circuit to form another RC circuit. The second end 82 of the series resistor circuit connects to the charging port 74 of the second charge storage circuit 56. The first end of each switch 78 separately connects to the second end of its associated resistor 76. The second end of each switch 78 connects to the controlling port 60 of the control unit 52.

Inside the control unit 52, the controlling port 60 can be in either a grounded state or a floating state. The voltage sensing units 68, 70 separately connected to the first end 80 and second end 82 of the series resistor circuit, are used for detecting the discharging voltage of the first end 80 and the second end 82 of the series resistor circuit, respectively. The processor 66 comprises a first transformation table 84 that stores look-up values of the resistance from each of the connecting points of neighboring resistors 76 to the first end 80 of the series resistor circuit, and a second transformation table 86 that stores look-up values of the resistance from each of the connecting points of neighboring resistors 76 to the second end 82 of the series resistor circuit.

When a key 44 is pressed, the corresponding switch 78 will be actuated, and under the condition that the controlling port 60 is in the grounded state, (the processor 66 controls the controlling port 60 to switch between a grounded state and a floating state, and the processor 66 begins counting the time as soon as the controlling port 60 is switched to the grounded state), the charge stored by the first charge storage circuit 54 will begin to discharge, and the resistance from the connecting point of the first end of the switch 78 to the first end 80 of the series resistor circuit will determine the discharging time of the RC circuit. The voltage of the first end 80 of the series resistor circuit will drop, and when it drops below a predetermined value the voltage sensing unit 68 will turn on. When the voltage sensing unit 68 turns on, the first detecting port 62 will sense a high voltage. The processor 66 will then measure the time period from when the RC circuit began to discharge (i.e., when the controlling port 60 was set to the grounded state) to when the first detecting port 62 senses a high voltage (that is, when the voltage sensing unit 68 generates a signal that the processor detects at port 62). Based upon this time period, the processor 66 will use the first transformation table 84 to determine the corresponding position of the actuated switch 78 and generate a key signal.

Similarly, when the controlling port 60 is in grounded state, the charge stored by the second charge storage circuit 56 will also begin to discharge. The resistance from the connecting point of the first end of the switch 78 to the second end 82 of the series resistor circuit will determine the discharging time of the second RC circuit. The voltage of the second end 82 of the series resistor circuit will drop, and when it drops below a predetermined value the voltage sensing unit 70 will turn on. The second detecting port 64 will sense a high voltage when the voltage sensing unit 70 turns on. Similarly, the processor 66 will then measure the time period from when the RC circuit began to discharge (when the controlling port 60 was set to the grounded state) to when the second detecting port 64 sensed a high voltage (i.e., when the voltage sensing unit 70 generates a signal that the processor detects at port 64). Based upon this time period, the processor 66 will use the second transformation table 86 to determine the corresponding position of the actuated switch 78 and generate a key signal.

When the controlling port 60 is in the floating state, the charge storage circuit 54 and the second charge storage circuit 56 will recharge. In fact, the voltage source (denoted by +5V) is always recharging the first and second charge storage circuit 54, 56. However, when a switch is actuated and the controlling port 60 is in the grounded state, because the discharging time is so much shorter than the recharging time, the charge storage circuits 54, 56 will discharge. When no is key pressed, though, or when the controlling port 60 is in the floating state, the charge storage circuits 54, 56 will recharge.

When a key 44 is pressed and a corresponding switch 78 is actuated, both the first detecting port 62 and the second detecting port 64 will detect the changing voltage and the same key signal will be obtained separately according to the first and second transformation tables 84, 86. When two keys 44 are simultaneously pressed, two switches 78 will be actuated. The two keys will be detected separately by the first and second detecting ports 62, 64. Then, according to the first and second transformation tables, two key signals will be obtained. However, when many keys 44 are pressed simultaneously, only two key signals will be obtained: the key that is closest to the first end 80 of the series resistor circuit, and the other that is closest to the second end 82 of the series resistor circuit.

Figure 4:
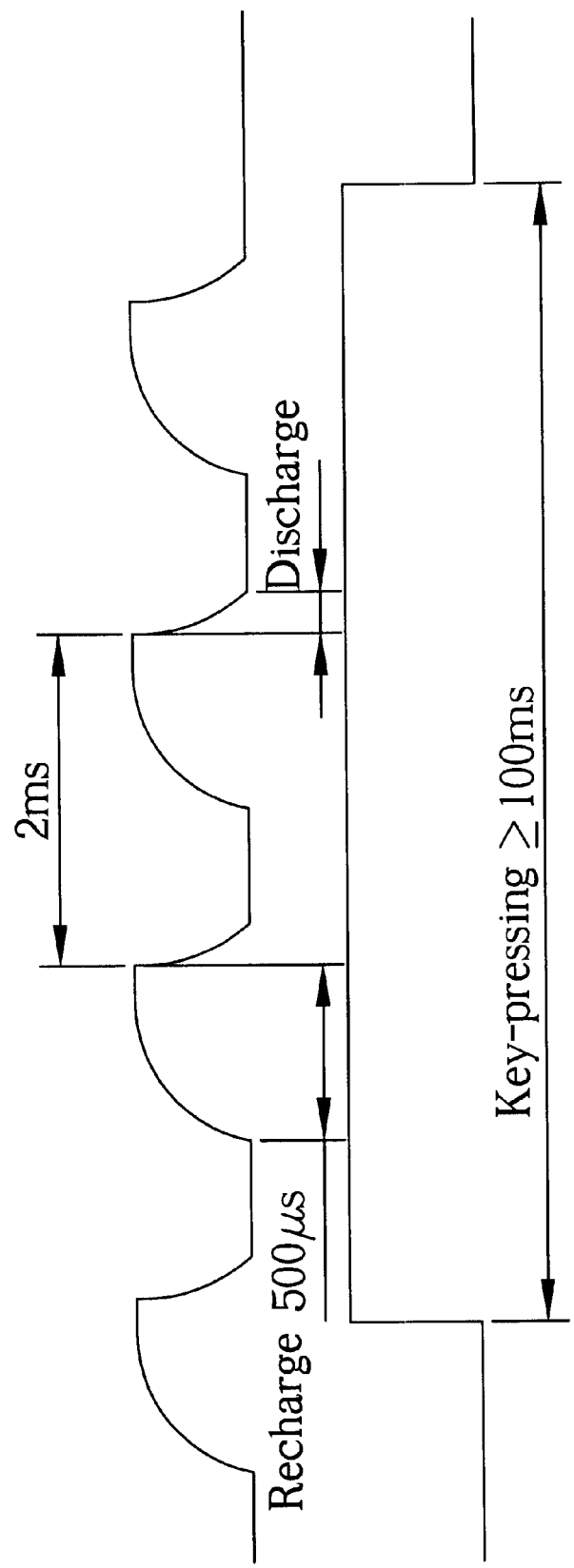
FIG. 4 is a timing diagram of the relationship of the key-pressing time period to the discharging-and-recharging time period.

Please refer to FIG. 4. FIG. 4 is a timing diagram of the relationship of the key-pressing time period and the discharging-and-recharging time period. In this embodiment, the resistance of each resistor of the series resistor circuit is 50Ω, the capacitance of each capacitor is 1 μF, and the voltage Vcc is 5V. Putting this into the formula for the discharging time period of a capacitor $$t \approx RC \ln \frac{Vcc}{Vcc - 0.9},$$

one gets t≈0.19845R, in units of μs. Hence, the discharging time period is very short. However, the recharging time period is determined by the capacitance and the resistance between the voltage source (denoted by +5V) and the charging port (72 or 74). Taking the resistance as 100 KΩ, for example, the recharging time period is then about 500 μs. The processor 66 switches the controlling port 60 between the grounded and floating states about every 2 ms. The controlling port 60 thus stays in the floating state for a period of time that is greater than 500 μs, and so the recharging of the capacitors can be completed. In the present invention, the discharging time period of the RC circuit begins when the controlling port 60 is grounded. This can lead to an incorrect first key signal as the key may have been pressed after the controlling port was grounded. This belated key press will lead to a longer perceived discharging time period, resulting in an incorrect key signal. According to experiments, it takes at least 100 ms to press a key once, and within this time period, according to the present embodiment, the processor 66 has scanned the keys several times. Hence, although the first key signal may be incorrect, there are still many correct key signals that follow. Consequently, the first key signal may be ignored, or an averaging of all the key signals can be performed, to eliminate the incorrect key signals. In short, one can design the processor to produce a correct key signal after having received several key signals. Hence, pressing keys quickly, or pressing a key for a long time, will not cause problems.

In this embodiment there are two charge storage circuits 54, 56 installed in the key-pressing circuit 50. It is thus designed to detect two keys pressed simultaneously. If only one key will always be pressed at a time, then only one charge storage circuit need be installed in the key-pressing circuit 50. In addition, the resistors 76 can be printed resistors on a printed circuit.

Figure 5:
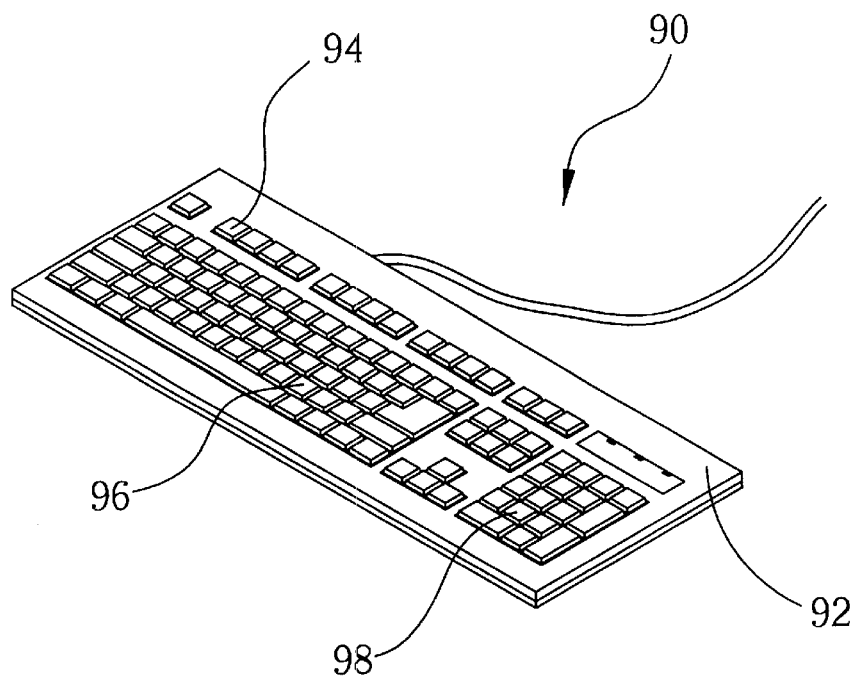
FIG. 5 is a perspective view of a computer keyboard.
Figure 6:
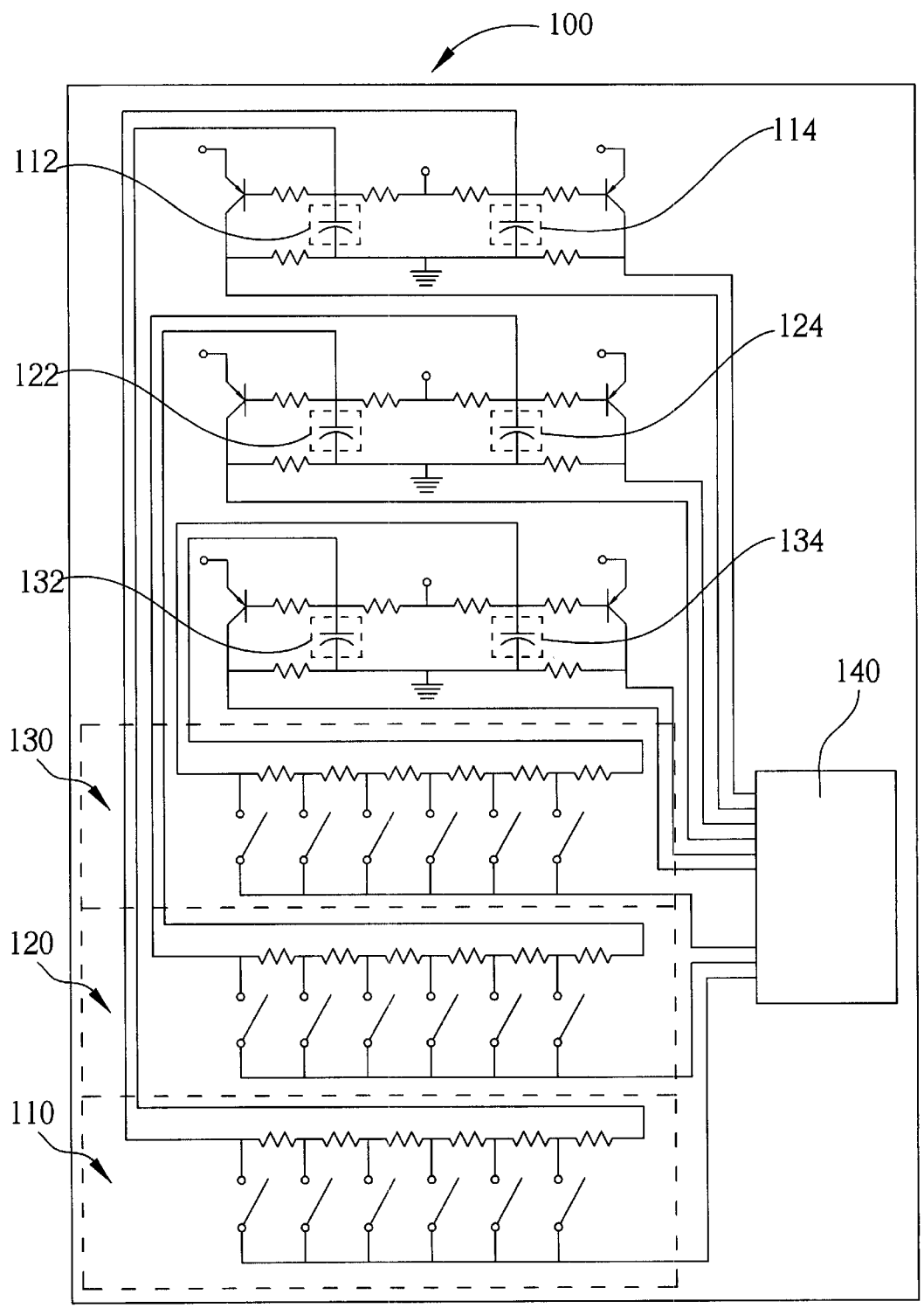
FIG. 6 is an alternative embodiment of the present invention key-pressing circuit.

Please refer to FIG. 5 and FIG. 6. FIG. 5 is a perspective view of a computer keyboard 90. FIG. 6 is an alternative embodiment of the present invention, a key-pressing circuit 100. The computer keyboard 90 comprises a housing 92 and three groups of the keys 94, 96, 98 installed in the housing 92 in a pressable manner. The computer keyboard 90 uses the present invention key-pressing circuit 100. Under each group of keys 94, 96, 98 there is separately installed a key matrix circuit 110, 120, 130 and two charge storage circuits for each group of keys: 112 and 114, 122 and 124, 132 and 134. Each group of keys can support two concurrent keys presses. Thus, the key-pressing circuit 100 can detect up to six concurrent keys presses. This supports most situations that require many concurrent keys presses. For example, when warm booting a typical personal computer, three keys must be pressed together: "ctrl", "alt" and "del". In this situation, the "ctrl" key and the "alt" key can be placed within the same group of keys, such as group 94, and the "del" key can be placed in another group of keys, such as group 98. Each group of keys only requires three ports on the processor 140, so the key-pressing circuit 100 only needs a total of nine ports.

According to the above description, the present invention key-pressing circuits 50, 100 do not have "ghost key" problems, and they require fewer ports on the processor than the prior art key-pressing circuit 10. Furthermore, the discharging process is performed many times within the time period of a key actuation, so the determination of the corresponding position of an actuated key is more accurate.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A key-pressing circuit used for encoding and decoding key-press position information of a keyed input device, the key-pressing circuit comprising:
    a control unit comprising a controlling port and a detecting port, the controlling port capable of being in either a grounded state or a floating state;
    a first charge storage circuit comprising a charging port that connects to the detecting port of the control unit;
    a key matrix circuit comprising a plurality of resistors and an associated plurality of switches, each of the resistors and each of the switches comprising a first end and a second end, the first end of each resistor connecting to the second end of its neighboring resistor so that the plurality of resistors forms a series resistor circuit that has a first end and a second end, the first end of each switch separately connecting to the second end of its associated resistor, the second end of each switch connecting to the controlling port of the control unit, the first end of the series resistor circuit connecting to the charging port of the first charge storage circuit;
    wherein when one of the switches is actuated and the controlling port is in the grounded state the first charge storage circuit will discharge, however when the controlling port is in the floating state the first charge storage circuit will recharge, the detecting port detects if the charging port of the first charge storage circuit reaches a predetermined voltage; wherein the control unit measures the time period from when the controlling port reached the grounded state till the detecting port detects the predetermined voltage, and the control unit determines the corresponding position of the actuated switch according to this time period.

2. The key-pressing circuit of claim 1 wherein the control unit comprises a processor and the processor comprises a first transformation table that stores look-up values of the resistance from the connecting points of neighboring resistors to the first end of the series resistor circuit.

3. The key-pressing circuit of claim 2 wherein the control unit further comprises at least one voltage sensing unit that connects to the first end of the series resistor circuit and is used to detect a voltage of the first end of the series resistor circuit.

4. The key-pressing circuit of claim 3 wherein the first charge storage circuit comprises a capacitor that connects to the first end of the series resistor circuit to form an RC circuit; wherein when the switch is actuated the resistance from the connecting point of the first end of the switch to the first end of the series resistor circuit will determine the discharging time of the RC circuit, and when the voltage of the first end of the series resistor circuit drops below a predetermined value the voltage sensing unit will generate a signal and the processor will measure the time period from when the RC circuit began to discharge to when the voltage sensing unit generated the signal, and according to this time period the processor will use the first transformation table to determine the corresponding position of the actuated switch.

5. The key-pressing circuit of claim 2 further comprising a second charge storage circuit that comprises a second charging port; wherein the second charging port connects to the second end of the series resistor circuit and connects to the detecting port of the control unit via a second voltage sensing unit.

6. The key-pressing circuit of claim 5 wherein the processor further comprises a second transformation table that stores look-up values of the resistance from the connecting points of neighboring resistors to the second end of the series resistor circuit.

7. The key-pressing circuit of claim 6 wherein the second charge storage circuit comprises a second capacitor that connects to the second end of the series resistor circuit to form a second RC circuit; wherein when the switch is actuated the resistance from the connecting point of the first end of the switch to the second end of the series resistor circuit will determine the discharging time of the second RC circuit, and when the voltage of the second end of the series resistor circuit drops below a predetermined value the second voltage sensing unit will generate a signal and the processor will measure the time period from when the second RC circuit began to discharge to when the second voltage sensing unit generated the signal, and according to this time period the processor will use the second transformation table to determine the corresponding position of the actuated switch.

8. The key-pressing circuit of claim 1 being an encoding-and-decoding circuit inside a keyboard that connects to a computer.

9. The key-pressing circuit of claim 8 wherein the keyboard comprises a housing and a plurality of buttons installed in the housing in a pressable manner, and under a group of buttons there is one key matrix circuit and one charge storage circuit.

10. The key-pressing circuit of claim 1 being an encoding-and-decoding circuit inside a remote controller.

11. The key-pressing circuit of claim 1 wherein the resistors are printed resistors on a printed circuit.

12. A key-pressing circuit used for encoding and decoding key-press position information of a keyed input device, the key-pressing circuit comprising:

a control unit comprising a controlling port, a first detecting port, and a second detecting port;

a first charge storage circuit and a second charge storage circuit, each charge storage circuit comprising a charging port, the charging port of the first charge storage circuit connecting to the first detecting port, the charging port of the second charge storage circuit connecting to the second detecting port;

a key matrix circuit comprising a plurality of resistors and an associated plurality of switches, each of the resistors and each of the switches comprising a first end and a second end, the first end of each resistor connecting to the second end of its neighboring resistor so that the plurality of resistors forms a series resistor circuit that has a first end and a second end, the first end of each switch separately connecting to the second end of its associated resistor, the second end of each switch connecting to the controlling port of the control unit, the first end of the series resistor circuit connecting to the charging port of the first charge storage circuit, the second end of the series resistor circuit connecting to the charging port of the second charge storage circuit;

wherein when at least one switch is actuated, the first and second charge storage circuits will discharge or recharge according to the controlling port, and the detecting port of the control unit detects if the corresponding charging port of the first and second charge storage circuits reaches a predetermined voltage; wherein the control unit measures the time period from when the first and the second charge storage circuits began to discharge till the corresponding detecting port of the control unit detects the predetermined voltage, and the control unit determines the corresponding positions of the actuated switches according to these time lengths.

13. The key-pressing circuit of claim 12 wherein the controlling port of the control unit can be in either a grounded state or a floating state; wherein when the controlling port is in the grounded state the first and second charge storage circuit will begin to discharge, however when the controlling port is in the floating state the first and second charge storage circuits will recharge.

14. The key-pressing circuit of claim 13 wherein the control unit comprises a processor and the processor comprises a first transformation table for storing look-up values of the resistance from the connecting points of neighboring resistors to the first end of the series resistor circuit, and a second transformation table for storing look-up values of the resistance from the connecting points of neighboring resistors to the second end of the series resistor circuit.

15. The key-pressing circuit of claim 14 wherein the control unit further comprises two voltage sensing units separately connected to the first end and the second end of the series resistor circuit, the voltage sensing units being used to detect the voltage of the first end and second end of the series resistor circuit.

16. The key-pressing circuit of claim 15 wherein both the first charge storage circuit and the second charge storage circuit comprise a capacitor that separately connects to the first end and the second end of the series resistor circuit to form an RC circuit; wherein when two switches are actuated simultaneously the resistances from the two connecting points of the first end of each switch to the first end and second end of the series resistor circuit separately determine the discharging time of each RC circuit, and when the voltage of the first end or the second end of the series resistor circuit drops below a predetermined voltage the corresponding voltage sensing unit will generate a signal and the processor will measure the time period from when the RC circuit began to discharge till when the corresponding voltage sensing unit generated the signal, and the processor will determine the corresponding position of the actuated switch using the time period and the first or second transformation table.

17. The key-pressing circuit of claim 12 being an encoding-and-decoding circuit inside a keyboard that connects to a computer.

18. The key-pressing circuit of claim 17 wherein the keyboard comprises a housing and a plurality of buttons installed in the housing in a pressable manner, and under a group of buttons there is one key matrix circuit and two charge storage circuits.

19. The key-pressing circuit of claim 12 being an encoding-and-decoding circuit inside a remote controller.

20. The key-pressing circuit of claim 12 wherein the resistors are printed resistors on a printed circuit.

* * * * *